(12) United States Patent
Maekawa et al.

(10) Patent No.: US 7,374,976 B2
(45) Date of Patent: May 20, 2008

(54) METHOD FOR FABRICATING THIN FILM TRANSISTOR

(75) Inventors: Shinji Maekawa, Kanagawa (JP);
Kengo Akimoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/713,219

(22) Filed: Nov. 17, 2003

(65) Prior Publication Data

US 2004/0101997 A1      May 27, 2004

(30) Foreign Application Priority Data

Nov. 22, 2002   (JP) .............................. 2002-340167

(51) Int. Cl.
*H01L 21/00*      (2006.01)
(52) U.S. Cl. ..................... 438/149; 438/151; 438/166
(58) Field of Classification Search ................ 438/149, 438/151, 154, 166
See application file for complete search history.

(56) References Cited

U.S. PATENT DOCUMENTS

| 3,535,775 | A | 10/1970 | Garfinkel et al. |
|---|---|---|---|
| 4,371,403 | A | 2/1983 | Ikubo et al. |
| 4,477,308 | A | 10/1984 | Gibson et al. |
| 4,534,820 | A | 8/1985 | Mori et al. |
| 4,727,044 | A | 2/1988 | Yamazaki |
| 5,244,819 | A | 9/1993 | Yue |
| 5,248,630 | A | 9/1993 | Serikawa et al. |
| 5,275,896 | A | 1/1994 | Garofalo et al. |
| 5,403,772 | A | 4/1995 | Zhang et al. |
| 5,426,064 | A | 6/1995 | Zhang et al. |
| 5,481,121 | A | 1/1996 | Zhang et al. |
| 5,488,000 | A | 1/1996 | Zhang et al. |
| 5,492,843 | A | 2/1996 | Adachi et al. |
| 5,501,989 | A | 3/1996 | Takayama et al. |
| 5,508,533 | A | 4/1996 | Takemura |

(Continued)

FOREIGN PATENT DOCUMENTS

EP          0 651 431 A2     5/1995

(Continued)

OTHER PUBLICATIONS

Kevin S. Jones, et al., "*Boron Diffusion Upon Annealing of Laser Thermal Processed Silicon*", ION Implantation Technology 2000 (IEEE 2000), pp. 111-114.

(Continued)

*Primary Examiner*—Laura M. Schillinger
(74) *Attorney, Agent, or Firm*—Nixon Peabody LLP; Jeffrey L. Costellia

(57) ABSTRACT

When a gettering sink is removed by using alkaline solution of etchant having a high selectivity to the gettering sink and a barrier film functioning as an etching stopper, residue of gettering is left. However, according to the present invention, a semiconductor film that serves as a gettering sink contains nitrogen at concentration of $1 \times 10^{18}$ atoms/cm$^3$ or lower, oxygen at concentration of $8 \times 10^{19}$ atoms/cm$^3$ or lower, and noble gas at concentration is of $1 \times 10^{20}$ atoms/cm$^3$ or higher. In order to achieve the above-described impurity concentrations, a concentration of oxygen that is an impurity element in a chamber is reduced by using a flammable gas for heating and exhausting oxygen.

12 Claims, 7 Drawing Sheets

U.S. PATENT DOCUMENTS

| | | |
|---|---|---|
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,551,984 A | 9/1996 | Tanahashi |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,773,327 A | 6/1998 | Yamazaki et al. |
| 5,789,284 A | 8/1998 | Yamazaki et al. |
| 5,814,540 A | 9/1998 | Takemura et al. |
| 5,843,225 A | 12/1998 | Takayama et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A | 8/1999 | Miyanaga et al. |
| 5,949,115 A | 9/1999 | Yamazaki et al. |
| 5,956,579 A | 9/1999 | Yamazaki |
| 5,960,252 A | 9/1999 | Matsuki et al. |
| 5,961,743 A | 10/1999 | Yamazaki et al. |
| 5,970,327 A | 10/1999 | Makita et al. |
| 5,977,559 A | 11/1999 | Zhang et al. |
| 5,985,740 A | 11/1999 | Yamazaki et al. |
| 5,997,286 A | 12/1999 | Hemsath et al. |
| 5,998,838 A | 12/1999 | Tanabe et al. |
| 6,013,544 A | 1/2000 | Makita et al. |
| 6,015,593 A | 1/2000 | Yonkoski et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A | 7/2000 | Henley et al. |
| 6,084,247 A | 7/2000 | Yamazaki et al. |
| 6,087,659 A | 7/2000 | Adler et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,168,981 B1 | 1/2001 | Battaglia et al. |
| 6,177,302 B1 | 1/2001 | Yamazaki et al. |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,287,988 B1 | 9/2001 | Nagamine et al. |
| 6,291,275 B1 | 9/2001 | Yamazaki et al. |
| 6,294,441 B1 | 9/2001 | Yamazaki |
| 6,294,815 B1 * | 9/2001 | Yamazaki et al. .......... 257/350 |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,326,249 B1 * | 12/2001 | Yamazaki et al. .......... 438/158 |
| 6,331,457 B1 | 12/2001 | Yamazaki et al. |
| 6,337,259 B1 | 1/2002 | Ueda et al. |
| 6,346,730 B1 | 2/2002 | Kitakado et al. |
| 6,362,507 B1 | 3/2002 | Ogawa et al. |
| 6,376,336 B1 | 4/2002 | Buynoski |
| 6,391,690 B2 | 5/2002 | Miyasaka |
| 6,396,147 B1 | 5/2002 | Adachi et al. |
| 6,399,454 B1 | 6/2002 | Yamazaki |
| 6,399,988 B1 | 6/2002 | Yamazaki |
| 6,420,758 B1 | 7/2002 | Nakajima |
| 6,426,245 B1 * | 7/2002 | Kawasaki et al. .......... 438/166 |
| 6,426,276 B1 | 7/2002 | Ohnuma et al. |
| 6,429,097 B1 | 8/2002 | Voutsas et al. |
| 6,436,745 B1 | 8/2002 | Gotou et al. |
| 6,461,943 B1 | 10/2002 | Yamazaki et al. |
| 6,472,684 B1 * | 10/2002 | Yamazaki et al. ............ 257/72 |
| 6,489,189 B2 | 12/2002 | Yamazaki et al. |
| 6,509,602 B2 * | 1/2003 | Yamazaki et al. .......... 257/314 |
| 6,512,504 B1 | 1/2003 | Yamauchi et al. |
| 6,531,713 B1 | 3/2003 | Yamazaki |
| 6,534,826 B2 | 3/2003 | Yamazaki |
| 6,541,294 B1 | 4/2003 | Yamazaki et al. |

| | | |
|---|---|---|
| 6,576,926 B1 | 6/2003 | Yamazaki et al. |
| 6,579,736 B2 | 6/2003 | Yamazaki |
| 6,605,497 B2 | 8/2003 | Yamazaki et al. |
| 6,635,929 B2* | 10/2003 | Yamazaki et al. .......... 257/350 |
| 6,680,577 B1 | 1/2004 | Inukai et al. |
| 6,686,262 B2 | 2/2004 | Yamazaki et al. |
| 6,693,044 B1* | 2/2004 | Yamazaki et al. .......... 438/745 |
| 6,709,902 B2 | 3/2004 | Kitakado et al. |
| 6,737,304 B2 | 5/2004 | Yamazaki et al. |
| 6,743,649 B2 | 6/2004 | Yamazaki et al. |
| 6,743,700 B2* | 6/2004 | Asami et al. ............... 438/476 |
| 6,756,640 B2* | 6/2004 | Yamazaki et al. .......... 257/347 |
| 6,808,968 B2 | 10/2004 | Yamazaki et al. |
| 6,812,081 B2 | 11/2004 | Yamazaki et al. |
| 6,821,828 B2* | 11/2004 | Ichijo et al. ................ 438/166 |
| 6,828,179 B2* | 12/2004 | Yamazaki et al. .......... 438/166 |
| 6,897,477 B2* | 5/2005 | Shibata et al. ................ 257/59 |
| 6,991,997 B2 | 1/2006 | Takayama et al. |
| 7,109,073 B2* | 9/2006 | Yamazaki ................... 438/150 |
| 7,196,400 B2* | 3/2007 | Yamazaki et al. .......... 257/627 |
| 7,256,080 B2* | 8/2007 | Park et al. .................. 438/166 |
| 2001/0034088 A1 | 10/2001 | Nakamura et al. |
| 2002/0028543 A1 | 3/2002 | Yamazaki et al. |
| 2002/0043660 A1* | 4/2002 | Yamazaki et al. ............. 257/59 |
| 2002/0086469 A1 | 7/2002 | Kim et al. |
| 2002/0098628 A1 | 7/2002 | Hamada et al. |
| 2002/0102764 A1 | 8/2002 | Yamazaki et al. |
| 2002/0106861 A1 | 8/2002 | Yamazaki |
| 2002/0125480 A1 | 9/2002 | Nakamura et al. |
| 2002/0134981 A1* | 9/2002 | Nakamura et al. ............. 257/62 |
| 2002/0142554 A1 | 10/2002 | Nakajima |
| 2002/0151120 A1 | 10/2002 | Yamazaki et al. |
| 2002/0151154 A1 | 10/2002 | Yamazaki et al. |
| 2002/0164843 A1 | 11/2002 | Yamazaki et al. |
| 2002/0182783 A1 | 12/2002 | Takayama et al. |
| 2002/0187594 A1 | 12/2002 | Yamazaki et al. |
| 2002/0197785 A1 | 12/2002 | Yamazaki et al. |
| 2003/0010980 A1* | 1/2003 | Yamazaki et al. ............. 257/65 |
| 2003/0059986 A1* | 3/2003 | Shibata ....................... 438/149 |
| 2003/0060057 A1 | 3/2003 | Raaijmakers et al. |
| 2003/0062499 A1 | 4/2003 | Yamazaki |
| 2003/0122129 A1 | 7/2003 | Yamazaki et al. |
| 2003/0132900 A1 | 7/2003 | Yamauchi et al. |
| 2003/0197179 A1 | 10/2003 | Yamazaki et al. |
| 2003/0232468 A1* | 12/2003 | Ohnuma ...................... 438/166 |
| 2004/0065902 A1 | 4/2004 | Yamazaki et al. |
| 2004/0101997 A1* | 5/2004 | Maekawa et al. ........... 438/151 |
| 2004/0106237 A1* | 6/2004 | Yamazaki ................... 438/149 |
| 2004/0121530 A1 | 6/2004 | Yamazaki et al. |
| 2004/0201023 A1* | 10/2004 | Yamazaki et al. ............ 257/75 |
| 2004/0224486 A1 | 11/2004 | Ichijo et al. |
| 2005/0009257 A1 | 1/2005 | Yamazaki et al. |
| 2005/0020037 A1 | 1/2005 | Asami et al. |
| 2005/0079656 A1 | 4/2005 | Ichijo et al. |
| 2005/0247940 A1* | 11/2005 | Shibata et al. ................ 257/66 |
| 2006/0040434 A1* | 2/2006 | Park et al. .................. 438/151 |
| 2006/0292761 A1* | 12/2006 | Yamazaki ................... 438/150 |

FOREIGN PATENT DOCUMENTS

| | | |
|---|---|---|
| JP | 05-109737 | 4/1993 |
| JP | 06-151414 | 5/1994 |
| JP | 07-130652 | 5/1995 |
| JP | 07-183540 | 7/1995 |
| JP | 08-078329 | 3/1996 |
| JP | 09-074207 | 3/1997 |
| JP | 10-055951 | 2/1998 |
| JP | 2000-105081 | 4/2000 |
| JP | 3032801 | 4/2000 |
| JP | 2000-260777 | 9/2000 |
| JP | 2001-181820 | 7/2001 |
| JP | 2001-210828 | 8/2001 |
| JP | 2001-267264 | 9/2001 |
| JP | 3032801 | 2/2002 |
| JP | 2002-313811 | 10/2002 |
| JP | 2003-100636 | 4/2003 |

OTHER PUBLICATIONS

Lurng S. Lee, et al., "Argon Ion-Implantation on Polysilicon or Amorphous-Silicon for Boron Penetration Suppression in $p^+$ pMOSFET", IEEE Transactions on Electron Devices, vol. 45, No. 8, Aug. 1998, pp. 1737-1744.

D. J. Llewellyn et al., "Implantation and annealing of Cu in InP for electrical isolation: microstructural characterization", IEEE Electron Device Letters, pp. 313-316.

M. Miyake, et al., "Characteristics of Buried-Channel pMOS Devices With Shallow Counter-Doped Layers Fabricated Using Channel Preamorphization", IEEE Transactions on Electron Devices, vol. 43, No. 3, Mar. 1996, pp. 444-449.

U.S. Appl. No. 08/784,293, Yamazaki et al., filed: Jan. 16, 1997, entitled: "Fabrication Method of Semiconductor Device," including the filing receipt, specification, claims, drawings, and the allowed claims as of Nov. 8, 2005.

* cited by examiner

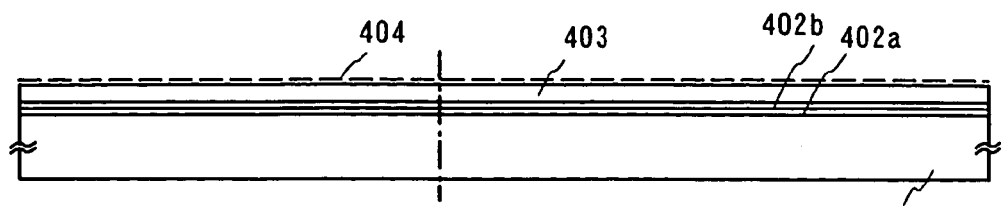
FIG. 4A
FIG. 4B
FIG. 4C
FIG. 4D
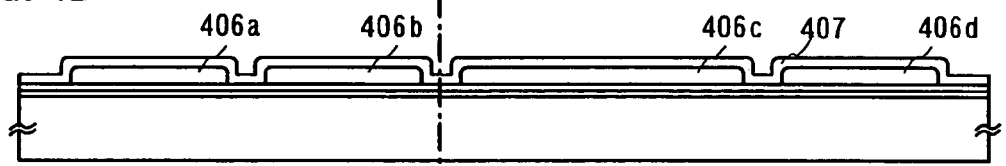
FIG. 4E
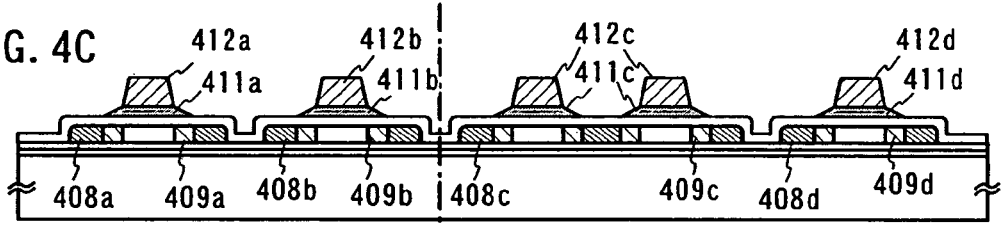
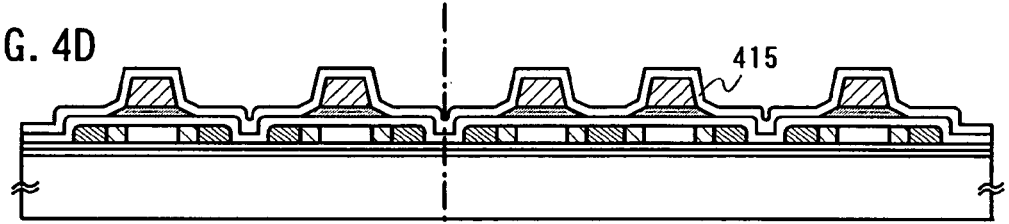
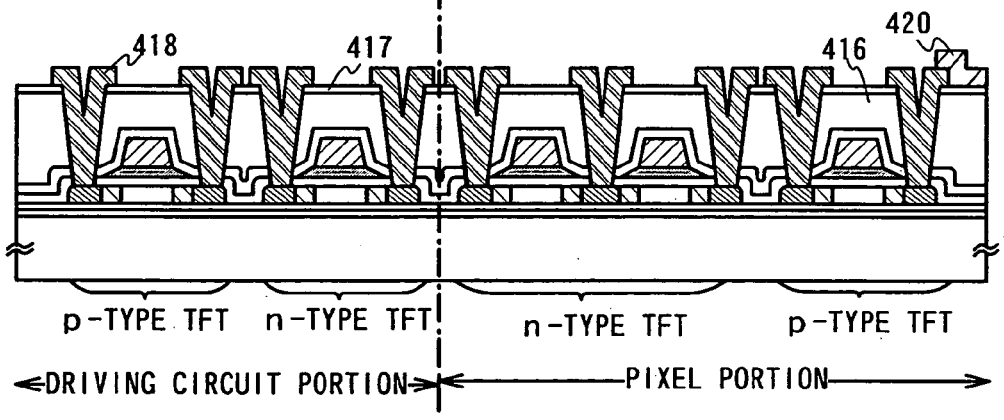
FIG. 4F p-TYPE TFT   n-TYPE TFT | n-TYPE TFT   p-TYPE TFT

←—DRIVING CIRCUIT PORTION—→←———PIXEL PORTION———→

DRIVING CIRCUIT PORTION   604  PIXEL PORTION
                                              DRIVING CIRCUIT PORTION p-TYPE TFT   n-TYPE TFT   n-TYPE TFT   p-TYPE TFT
←—DRIVING CIRCUIT PORTION—→←———PIXEL PORTION———→

PIXEL PORTION
702   DRIVING CIRCUIT PORTION
DRIVING CIRCUIT PORTION

METHOD FOR FABRICATING THIN FILM TRANSISTOR

BACKGROUND OF THE INVENTION

1. Field of the Invention

The present invention relates to a thin film transistor and fabricating method thereof, further, a semiconductor device and a manufacturing method thereof.

2. Description of the Related Arts

In recent years, researches on high performance semiconductor devices (specifically, liquid crystal display devices, EL display devices and other display devices) using a thin film transistor have been promoted. A thin film transistor (hereinafter, referred to as a TFT) having high mobility needs to be realized particularly for a semiconductor device which is required to have high-speed performance and increased functionality. As a method for improving the crystallinity of the semiconductor film, a metal element, as typified by Ni, which promotes crystallization of an amorphous silicon film is doped, formed into a film, or applied on the semiconductor film (all of which are referred to as forming a substance having a metal element), and then, the semiconductor film is heated and a crystallization process for forming a crystalline semiconductor film is performed on the semiconductor film.

In the crystallization process described above, a crystalline semiconductor film with large-size particles is obtained by using a metal element typified by Ni to promote crystallization. In addition, the crystalline semiconductor film that grain boundaries are connected with each other at high ratio and grain defects are less is obtained.

However, a metal element such as Ni has an adverse effect on device properties (electric properties) of a TFT, and therefore, a step for removing the elements (hereinafter referred to as a gettering) is carried out. A gettering is known as a technique for segregating metal impurities brought in a semiconductor to a gettering sink (or it is also called a gettering site) with some kind of energy, thereby reducing impurity density in an active device region.

Gettering processes are divided broadly into two categories, an extrinsic gettering and an intrinsic gettering. The extrinsic gettering provides a gettering effect by applying a strain field or chemical action from the exterior. Meanwhile, the intrinsic gettering utilizes a strain field of a lattice defect caused by oxygen that is generated inside a single crystal silicon wafer.

As a specific example of gettering processes, a gettering is performed by forming a region added with a noble gas element (noble gas) or a semiconductor film added with a noble gas element and moving a metal element thereinto by heat treatment. Thereafter is removed the region doped with a noble gas element (noble gas) or the semiconductor film doped with a noble gas element (Reference: Japanese Patent Laid-Open No. 2002-313811).

However, when a gettering sink is removed by gettering according to the above-described method, the gettering sink could not be etched rightly in some cases. That is, even when a gettering sink is removed by using alkaline solution of etchant having a high selectivity to the gettering sink and a barrier film functioning as an etching stopper, residue of the gettering sink is left.

A TFT having such residue of gettering sink has a negative characteristic such as bad leakage of off-current (Ioff) and low reliability. Further, defects generate in a mass-production line due to the gettering residue, and thus, the yield ratio decreases.

SUMMARY OF THE INVENTION

It is an object of the present invention to provide a method for fabricating a TFT in which a gettering sink can be removed without leaving residue in a process for crystallizing a semiconductor film by using a metal element. Further, it is another object of the present invention to provide a semiconductor device provided with a TFT formed according to the present invention.

In order to achieve the above-described objects, the present invention which focuses on impurities of a semiconductor film that serves as a gettering sink, is characterized in that nitrogen ($N_2$) concentration is $1 \times 10^{18}$ atoms/cm$^3$ or lower, oxygen ($O_2$) concentration is $8 \times 10^{19}$ atoms/cm$^3$ or lower in the semiconductor film. Further, the present invention is characterized setting noble gas concentration $1 \times 10^{20}$ atoms/cm$^3$ or higher so that a semiconductor film as a gettering sink can achieve a desired gettering function. As the noble gas element, one or more elements selected from the group consisting of helium (He), neon (Ne), argon (Ar), krypton (Kr), and xenon (Xe) is/are used.

In order to achieve the above-described concentrations of the impurities, the present invention is characterized that oxygen that is an impurity in a chamber is reduced by using a flammable gas for burning and exhausting oxygen. This flammable gas can be used a gas including any one selected from the group consisting of: $SiH_4$, $Si_2H_6$, $SiH_2Cl_2$, $SiHCl_3$, $SiCl_4$, $GeH_4$, $PH_3$, $B_2H_6$, $AsH_3$, and $H_2Se$.

Further, in order to achieve the above-described concentrations of the impurities, the present invention is characterized in that: an electrode including Ti is used, and a voltage is applied to the electrode to generate plasma, at the same time, oxygen that is the impurity in a chamber is reduced by exhausting. Alternatively, a filament including Ti is disposed in a chamber (film formation chamber) and the oxygen in the chamber may be reduced by exhausting, while the filament is being heated.

A semiconductor film that serves as a gettering sink is formed by high frequency sputtering method in the chamber in which the pretreatment to reduce the impurity concentrations as described above. When the semiconductor film that serves as a gettering sink is formed, a noble gas element is added to the semiconductor film that serves as a gettering sink by an ion implantation method or an ion doping method, or the noble gas element is assimilated when the semiconductor film that serves as a gettering sink is formed.

For a heat treatment for gettering, LRTA (Lamp Rapid Thermal Anneal) method which is performed by radiation of one or more lamps selected from the group consisting of: a halogen lamp, a metal halide lamp, a xenon arc lamp, a carbon arc lamp, a high pressure natrium lamp, and a high pressure mercury lamp; GRTA (Gas Rapid Thermal Anneal) method which is performed by using an inert gas such as N or Ar as a heating medium; or a furnace annealing method which is performed by using an electric heating furnace may be adopted. This heat treatment allows a metal element to diffuse and move into the semiconductor film that serves a gettering sink.

Note that, one or more elements selected from the group consisting of iron (Fe), nickel (Ni), cobalt (Co), ruthenium (Ru), rhodium (Rh), palladium (Pd), osmium (Os), iridium (Ir), platinum (Pt), copper (Cu), and gold (Au) is/are used for a metal element.

Subsequently, the semiconductor film that is a gettering sink is removed appropriately by etching. As an etching method, a wet etching method that is performed by using an alkaline solution typified by hydrazine or tetramethyl ammonium hydroxide (TMAH, chemical formula:$(CH_3)_4NOH$) is employed.

At this time, preferably, a barrier film serving as an etching stopper is formed at an interface between a semiconductor film that is an active layer of a TFT and the semiconductor film that is a gettering sink. Then, the barrier film is removed by using hydrofluoric acid. As the barrier film, a thin oxide film (chemical oxide) that is processed by ozone water, or a solution in which sulfuric acid, hydrochloric acid, or nitric acid is mixed with hydrogen peroxide solution can be used. Alternatively, a plasma treatment in an oxygen atmosphere may be performed, or an ultraviolet irradiation in an atmosphere containing oxygen may be performed to generate ozone for oxidation treatment. In place of the above-described methods, a thin oxide film may be formed by being heated at temperatures from 200° C. to 350° C. using a clean oven or an oxide film of from 1 to 5 nm thick may be formed by a plasma CVD method, a sputtering method, or a vapor deposition method.

According to the present invention, a pretreatment for reducing impurity concentrations is performed in a chamber in which a semiconductor film that serves as a gettering sink is formed. As a result, the impurity concentrations of the semiconductor film that serves as a gettering sink is reduced, and thus, etch residue can be reduced. Accordingly, less etch residue is left, as compared with a method for fabricating a TFT formed by using a semiconductor film that serves as a gettering sink, made according to a conventional method, and therefore, the yield ratio in fabricating a semiconductor device having a TFT is enhanced.

BRIEF DESCRIPTION OF THE DRAWINGS

In the accompanying drawings:

FIGS. 4A to 4F show steps for fabricating an active matrix substrate according to the present invention;

DETAILED DESCRIPTION OF THE PREFERRED EMBODIMENTS

EMBODIMENT MODES

Hereinafter, the embodiment modes of the present invention are described with reference to figures. Note that, in all figures for describing the embodiment modes, the same reference numbers are used for devices or portions that have the same function. Descriptions about the same reference numbers are omitted.

EMBODIMENT MODES 1

In this embodiment mode, an example of forming a semiconductor film that serves as a gettering sink in a chamber in which impurity concentration is reduced by using a flammable gas is described with reference to FIG. 1.

Figure 1:
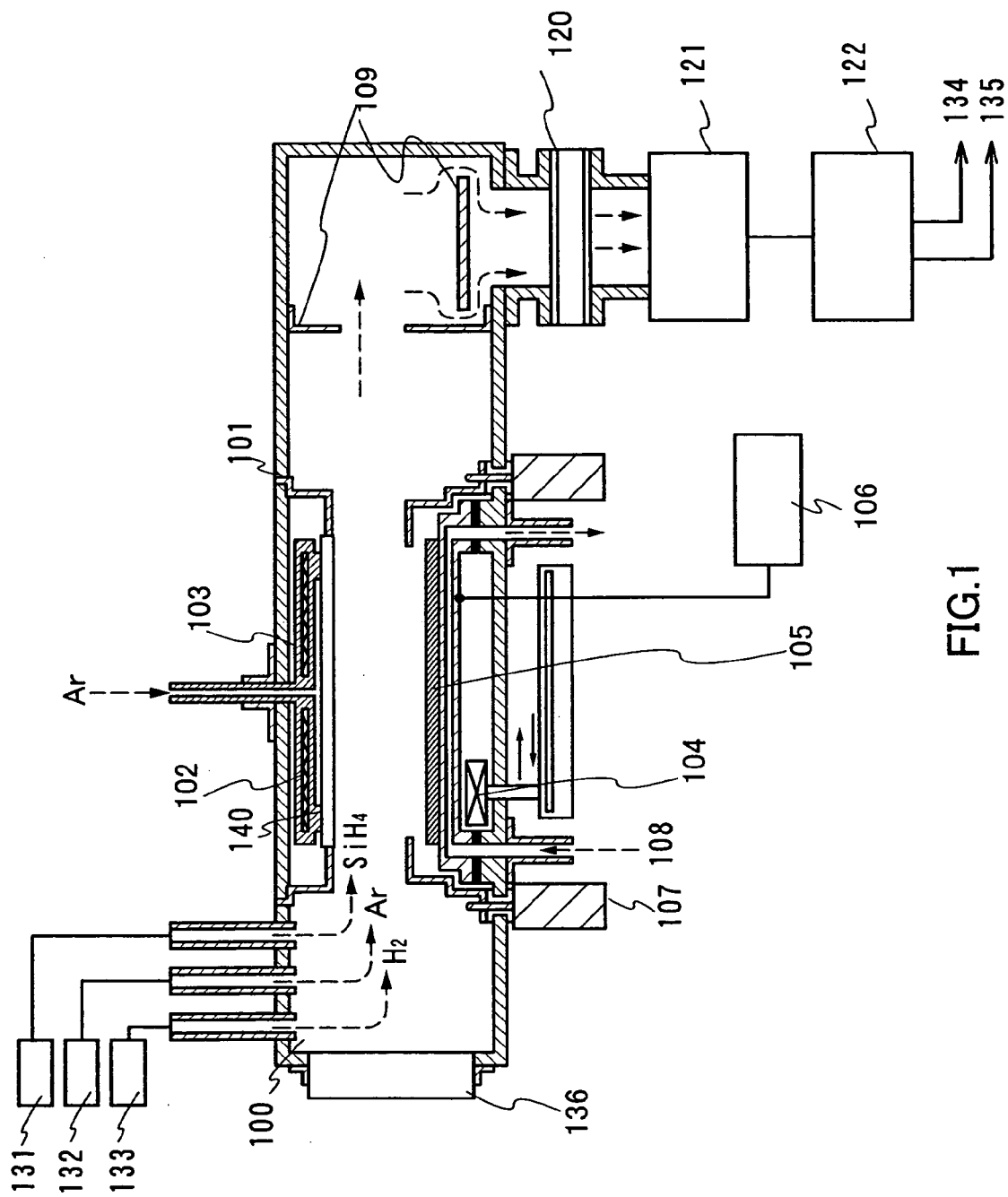
FIG. 1 shows a sputtering apparatus according to the present invention.

FIG. 1 shows a sputtering apparatus for forming a semiconductor film that serves as a gettering sink. The sputtering apparatus includes a film formation chamber 100, a substrate holder 101, a magnetic material (magnet) 102, a substrate holding means 103 in the upper portion of the film formation chamber, a first gas supply means 131 for supplying $SiH_4$ that is an example of flammable gases, and a second gas supply means 132 for supplying argon (Ar) that is an example of noble gases. In addition, a third gas supply means 133 for supplying hydrogen ($H_2$) may be provided. This hydrogen gas can make the degree of mixing a flammable gas and a noble gas high, and thus, the gases can be supplied smoothly.

On the side opposite to the substrate holder 101, a target 105 is provided and an electric power is supplied from a high frequency power supply 106. A target lifting means 107 (that can carry up and down the target) having a function of controlling the distance between the substrate and the target is provided. A permanent magnet 104 for producing electric field to the target and a coolant 108 for cooling the target are provided in the vicinity of the target. A current plate 109 for controlling the gas flow is provided and an exhausting means such as a pump is provided via a conductance valve 120. The exhausting means includes a turbo pump 121 that is a first exhausting means and a rotary pump or a dry pump 122 that is a second pump. Thereafter, the gases are exhausted through two exhausting systems: a first exhausting system 134 and a second exhausting system 135. This is because it is necessary to prevent the flammable gas and the reactive gas from reacting with each other.

Further, the sputtering apparatus is preferably connected to a plasma CVD apparatus or the like via a transferring gate 136 in order to be used as a multi-chamber Next, a method for fabricating a semiconductor film that serves as a gettering sink by using the sputtering apparatus shown in FIG. 1 is described below.

A substrate 140 is held in the substrate holder 101, and then the substrate 140 is installed in the substrate holding means 103. In this embodiment mode, a case is described where a pretreatment is performed while the substrate is set in the substrate holding means 103. The present invention, however, is not limited to this structure in setting the substrate.

The pretreatment for reducing the impurity concentration in the film formation chamber is as follows; monosilane ($SiH_4$) gas that is a flammable gas and argon (Ar) that is a noble gas through the first gas supply means 131 and the second gas supply means 132 are supplied into the film formation chamber 100 respectively. Also, hydrogen ($H_2$) gas is, preferably, supplied into the film formation chamber 100 through the third gas supply means 133. At this time, the flow rate of the gas ($SiH_4$) is set to approximately 200 sccm.

In place of monosilane ($SiH_4$), a gas including any one selected from the group consisting of $Si_2H_6$, $SiH_2Cl_2$, $SiHCl_3$, $SiCl_4$, $GeH_4$, $PH_3$, $B_2H_6$, $AsH_3$ and $H_2Se$ may be supplied. Further, in place of argon (Ar), a gas including any element selected from the group consisting of helium (He), neon (Ne), krypton (Kr), and xenon (Xe).

Subsequently, air in the film formation chamber is exhausted through the turbo pump 121 and the rotary pump 122. Note that, a dry pump may be used instead of the rotary pump. As a result, an impurity element (specifically, oxygen) is exhausted with monosilane gas that is a flammable gas to the outside of the film formation chamber. The pressure of the film formation chamber is set to approximately 1 Torr (133 Pa).

In this state, the pretreatment for the sputtering apparatus is performed for about 5 to 10 minutes. As a result, the oxygen concentration in the film formation chamber can be reduced. Note that, the substrate 140 set in the substrate holder 101 is preferably heated at temperatures from 100° C. to 200° C. Of course, the pretreatment may be performed by supplying the gases even in the state in which the substrate is not set in the substrate holder 101.

According to the above-described method, the impurity concentration (specifically, oxygen concentration) of the film formation chamber is reduced by reacting a flammable gas typified by monosilane with oxygen. After that, the supply of a monosilane gas and a hydrogen gas through the first and third gas supply means is stopped to supply only an argon gas into the film formation chamber. At this time, the argon gas flow rate is set to from 50 to 1000 sccm, preferably, from 50 to 200 sccm. In order to set the pressure of the film formation chamber approximately from 0.3 to 2 Torr (39.9 to 266 Pa), the turbo pump 121 or the rotary pump 122 is controlled.

The distance between the substrate 140 and the target 105 including silicon (Si) is adjusted appropriately by using the target lifting means 107. Alternatively, the substrate may be carried up and down by using the substrate holding means 103.

In this state, the high frequency power supply 106 is operated to apply high frequency to the target. Further, the target is applied with magnetic field by using the permanent magnet 104 that can move under the target. Thus, a semiconductor film that serves as a gettering sink over the substrate is formed. It is noted that the treatment time is set to 1 to 20 minutes, preferably approximately 5 minutes in this embodiment mode, although it should be set in view of deposition conditions or throughput.

Moreover, the substrate may be applied with magnetic field by using the magnetic material (magnet) 102. Preferably, a heated argon gas is supplied to the substrate from above the substrate in order to spray the surface to be deposited and the back side (a face not to be deposited) of the substrate. The flow rate of the heated argon gas may be set to approximately 10 to 50 sccm.

In the film formation chamber in which the pretreatment is preformed, a semiconductor film to serve as a gettering sink that is formed by sputtering has nitrogen concentration of $1 \times 10^{18}$ atoms/cm$^3$ or lower, oxygen concentration of $8 \times 10^{19}$ atoms/cm$^3$ or lower, and noble gas concentration of $1 \times 10^{20}$ atoms/cm$^3$ or higher. The thus obtained semiconductor film is suitable for a gettering sink, because it is not easily crystallized during the gettering process.

The gettering sink of the present invention formed according to the above-described method is heated to perform gettering on an metal element within a semiconductor film that becomes a TFT active layer, and therefore, the etch residue can be reduced when the semiconductor film that serves as a gettering sink is removed.

EMBODIMENT MODES 2

In this embodiment mode, an example of forming a semiconductor film that serves as a gettering sink by a method different from that of Embodiment Mode 1 is described with reference to FIG. 2.

Figure 2:
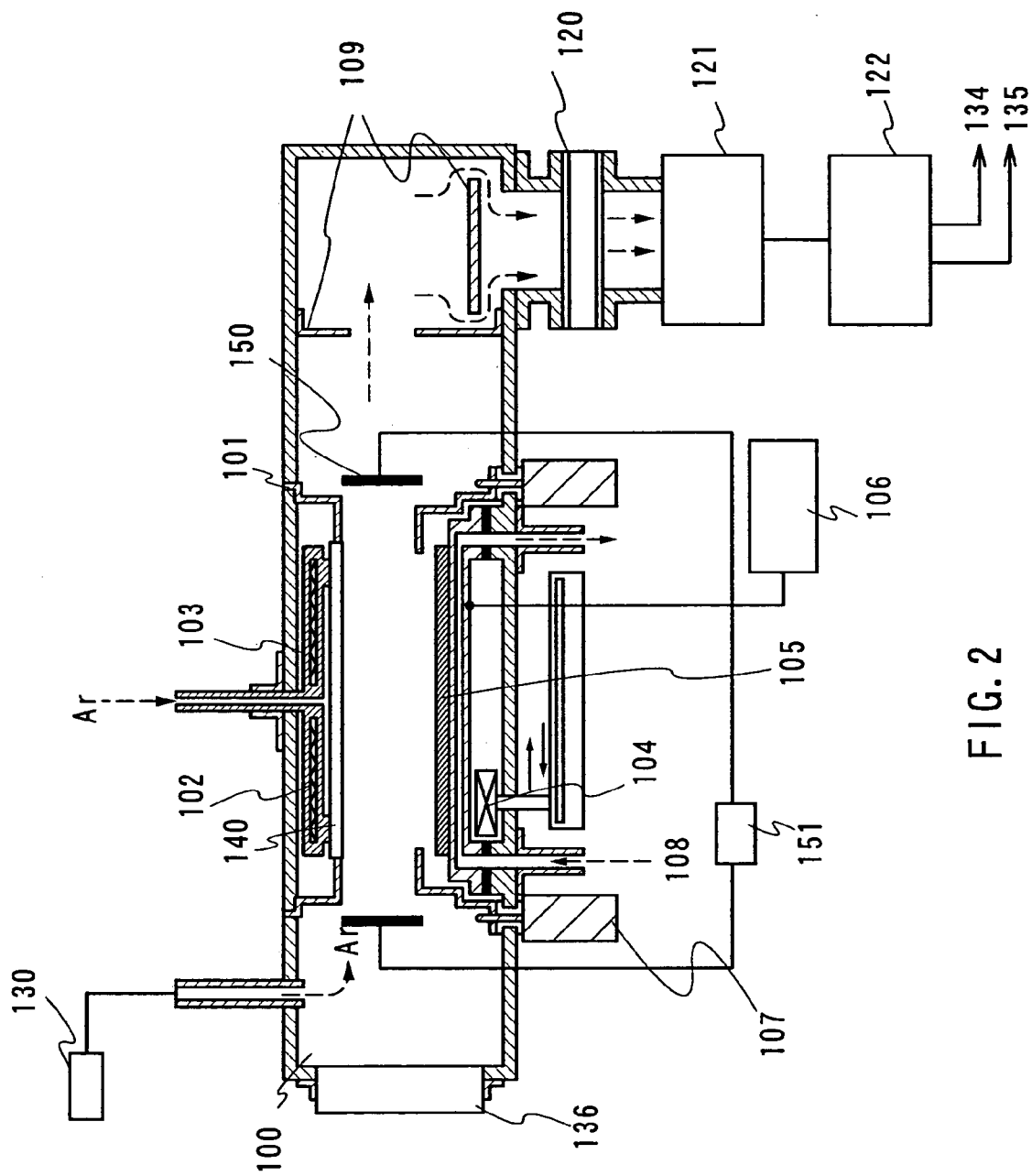
FIG. 2 shows a sputtering apparatus according to the present invention.

FIG. 2 shows a sputtering apparatus for forming a semiconductor film that serves as a gettering sink. The sputtering apparatus shown in FIG. 2 is different from that shown in FIG. 1 in that an electrode 150 including Ti is disposed in a film formation chamber 100 and a voltage is applied by an electrode power supply 151 to generate plasma in the interelectrode. The electrode 150 has a structure in which a target 105 is disposed between the electrodes and is perpendicular to the target.

Next, a method for forming a semiconductor film that serves as a gettering sink by using the sputtering apparatus shown in FIG. 2 is described below.

A substrate 140 is held in a substrate holder 101, and then the substrate 140 is installed in a substrate holding means 103. In this embodiment mode, a case where a pretreatment is performed while the substrate is set in the substrate holding means 103 is described. The present invention, however, is not limited to this structure in setting the substrate during the pretreatment process.

As the pretreatment in a film formation chamber, a voltage is applied to the electrode 150 from the electrode power supply 151. Plasma is generated in the interelectrode and thus, a titanium radical is generated. The titanium radical is reacted with oxygen in the film formation chamber, and then, is exhausted together with the oxygen through an exhausting means, thereby reducing the oxygen concentration of the film formation chamber. At this time, the pressure of the film formation chamber may be set to approximately $10^{-4}$ Pa.

A pretreatment for forming a semiconductor film that serves as a gettering sink is performed in this state for about 5 to 10 minutes. As a result, the oxygen concentration of the film formation chamber is reduced. Alternatively, in the case where the pretreatment is performed when the substrate is set in the substrate holding means 103, it is preferable that the substrate be heated at approximately 150° C.

A voltage is applied to the electrode including Ti to generate plasma and the impurity concentration of the film formation chamber is reduced due to the reaction of oxygen and the plasma as described above. After that, a noble gas element is supplied to the film formation chamber through a first gas supply means 130. Note that, in this embodiment mode, an argon gas is used as the noble gas element. At this time, the argon gas flow rate is set to from 10 to 100 sccm, and the pressure of the film formation chamber is set to from 0.2 to 0.9 Pa, preferably, about 0.3 Pa.

A target lifting means 107 is used to control the distance between the substrate 140 and the target 105 including Si appropriately. In addition, the substrate may be carried up and down by using the substrate holding means 103.

In this state, a high frequency power supply 106 is operated to apply high frequency power to the target. Further, the target is applied with magnetic field by using a permanent magnet 104 that can move under the target. It is noted that, in this embodiment mode, electric power applied to the target (12 square inches in size) is set to from 0.5 to 3 Kw, and preferably, the substrate 140 is heated at temperatures from 25 (the room temperature) to 300° C. Thus, a semiconductor film that serves as a gettering sink over the substrate is formed. It is noted that the treatment time is set to 1 to 20 minutes, preferably approximately 5 minutes in this embodiment mode, although it should be set in view of deposition conditions or throughput.

Moreover, the substrate may be applied with magnetic field by using a magnetic material (magnet) 102. Preferably, a heated argon gas is supplied to the substrate from above the substrate in order to spray the surface to be deposited and the back side (a face not to be deposited) of the substrate. The flow rate of the heated argon gas is set to approximately 10 to 50 sccm.

Figure 3:
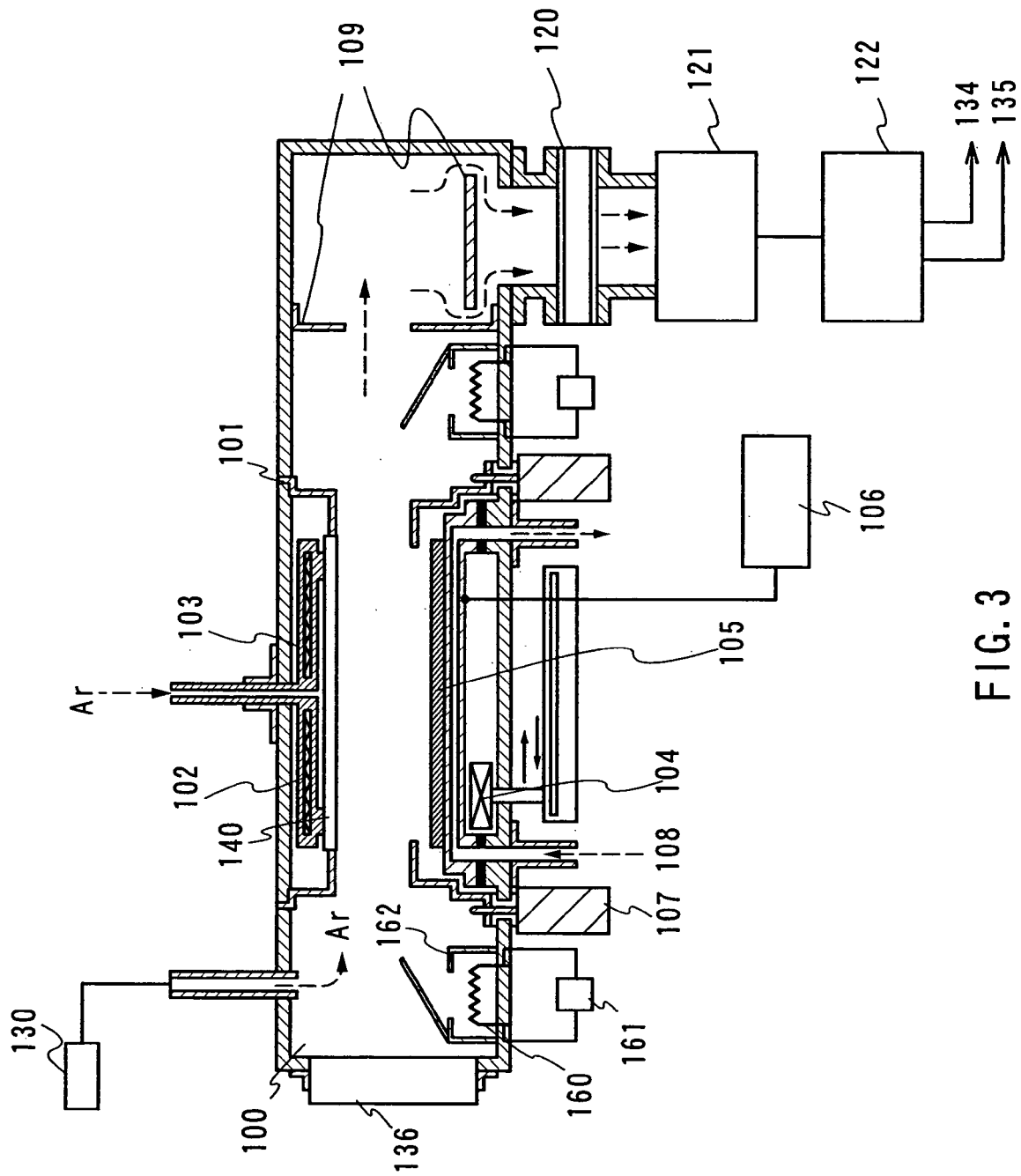
FIG. 3 shows a sputtering apparatus according to the present invention.

In place of the electrode including Ti shown in FIG. 2, a filament 160 including Ti may be disposed as shown in FIG. 3. Preferably, the filament 160 is controlled to be heated by a filament power supply 161 only during the pretreatment. Specifically, a wall having a box-like shape 162 is arranged to surround the filament 160 as shown in FIG. 3. A lid of the wall having a box-like shape is controlled to be open during the pretreatment, whereas the lid is controlled to be closed during sputtering.

In FIG. 3, the two filaments are disposed symmetrically across the target. However, the number of the filament may be one, or three or more. In any case, the number of the filament is set appropriately.

A method for forming a semiconductor film that serves as a gettering sink by using the sputtering apparatus shown in FIG. 3 are the same as that in the case of disposing an electrode including Ti shown in FIG. 2. Therefore, a description thereof is omitted here.

The semiconductor film to serve as a gettering sink that is formed in the film formation chamber in which the pretreatment is preformed has nitrogen concentration of $1\times10^{18}$ atoms/cm$^3$ or lower, and oxygen concentration of $8\times10^{19}$ atoms/cm$^3$ or lower. Further, the semiconductor film that serves as a gettering sink has noble gas concentration of $1\times10^{20}$ atoms/cm$^3$ or higher. The thus obtained semiconductor film is suitable for a gettering sink, because it is not easily crystallized during the gettering process.

The gettering sink of the present invention formed according to the above described method is heated to perform gettering on an metal element within a semiconductor film that becomes a TFT active layer, and therefore, the etch residue can be reduced when the semiconductor film that serves as a gettering sink is removed.

EMBODIMENT MODE 3

In this embodiment mode, a method for fabricating an active matrix substrate having a TFT formed by gettering by using a gettering sink according to the present invention is described. In addition, multiple TFTs are formed over the active matrix substrate. Here, a driver circuit portion having an n-channel TFT and a p-channel TFT and a pixel portion having an n-channel TFT are described.

As shown in FIG. 4A, a base insulating film having a laminated structure of an insulating film such as a silicon oxide film, a silicon nitride film, or a silicon oxynitride film is formed over a substrate 401 having an insulating surface (hereinafter, referred to as an insulating substrate). In this embodiment mode, two-layer structure is employed as the base insulating film. However, a single layer or two- or more-layer structure of the insulating films may be employed. As a first layer 402*a* of the base insulating film, a silicon oxynitride film is formed to be 10 to 200 nm in thickness (preferably, 50 to 100 nm) is formed by using SiH$_4$, NH$_3$, N$_2$O and H$_2$ as reaction gases by a plasma CVD method. Here, the silicon oxynitride film is formed to have a thickness of 50 nm. Then, as a second layer 402*b* of the base insulating film, a silicon oxynitride film is formed to be 50 to 200 nm in thickness (preferably, 100 to 150 nm) is formed by using SiH$_4$ and N$_2$O as reaction gases by plasma CVD method. Here, the silicon oxynitride film is formed to have a thickness of 100 nm. The base film is provided for the sake of preventing alkaline metal included in the insulating substrate from diffusing into the semiconductor film.

Subsequently, a first semiconductor film 403 is formed over the base film. The first semiconductor film may be formed by a well-known method (a sputtering method, a LPCVD method, or a plasma CVD method). In this embodiment mode, the first semiconductor film is formed to be 10 to 100 nm in thickness from a semiconductor material including silicon as a main component by plasma CVD method. To obtain a better crystal structure, the impurity concentrations of oxygen, nitrogen or the like of the first semiconductor film may be reduced to $5\times10^{18}$ atoms/cm$^3$ or lower. For these reasons, a high purity material gas (a source gas) is used, and an ultra high vacuum CVD apparatus equipped with a mirror polishing (electrolytic polishing) reaction chamber or an oil-free vacuum pumping system may be used.

A substance (in a film-form or in a liquid condition) having a metal element typified by nickel (Ni) is formed over the first semiconductor film by any one method of a spin coating, a dip coating method, a plasma CVD method, a sputtering method, and a vapor deposition method. In this embodiment mode, nickel (Ni) is used and a metal element containing film 404 is formed by spin-coating a nickel acetate salt solution containing nickel of 1 to 100 ppm in weight. In this case, in order to enhance wettability of the first semiconductor film and the nickel acetate salt solution, preferably, an extreme thin oxide film is formed by using an ozone containing aqueous solution. Further, the extreme thin oxide film is removed once, and then, another extreme thin oxide film is formed by an ozone containing aqueous solution again. A film of the solution containing a metal element is formed over the first semiconductor film by forming the thin oxide film according to the above-described manner.

Then, in this state, a heat treatment for crystallizing the first semiconductor film is performed to form a crystalline semiconductor film (a crystalline silicon film in this embodiment mode). For a heat treatment, a furnace annealing method performed by using an electric heating furnace, a lamp rapid thermal anneal method (LRTA) performed by using a halogen lamp, a metal halide lamp, a xenon arc lamp, a carbon arc lamp, a high pressure natrium lamp, a high pressure mercury lamp or the like may be employed. Alternatively, a gas rapid thermal anneal method (GRTA) may be employed.

Furthermore, in order to enhance crystallinity of the first semiconductor film and repair defects left within crystal grains, the first semiconductor film may be irradiated with a laser beam. A continuous wave or pulsed type of gas laser or solid state laser can be used as the laser oscillator. An excimer laser, an Ar laser and a Kr laser are given as the gas laser, while a YAG laser, a YVO$_4$ laser, a YLF laser, a YAlO$_3$ laser, a glass laser, a ruby laser, an Alexandrite laser, and a Ti: Sapphire laser are given as the solid state laser.

When the first semiconductor film is crystallized, it is preferable that the second harmonic through the fourth harmonic of basic waves is applied by using the solid state laser which is capable of oscillating continuously in order to obtain crystals in large grain size. Typically, it is preferable that the second harmonic (with a thickness of 532 nm) or the third harmonic (with a thickness of 355 nm) of an Nd: YVO$_4$ laser (basic wave of 1064 nm) is applied.

In this embodiment, a laser beam emitted from the continuous wave type YVO$_4$ laser with 10 W output is converted into a harmonic by using a non-linear optical element. Also, a method of emitting a harmonic by applying crystals of YVO$_4$ and the non-linear optical element into a resonator can be given. Then, preferably, the laser beam is shaped into a rectangular shape or an elliptical shape by an optical system, thereby irradiating the first semiconductor film. At this time, the energy density of approximately 0.01 to 100 MW/cm$^2$ (preferably 01. to 10 MW/cm$^2$) is required. The semiconductor film or the laser beam is moved at approximately 0.5 to 2000 cm/s rate relatively so as to irradiate the first semiconductor film.

A metal element (Ni in this embodiment mode) is left in the crystalline semiconductor film formed as described above. The concentration of the metal element within the first semiconductor film is reduced by a gettering method that is described below.

An insulating film that serves as a barrier film is formed over the first semiconductor film that is crystallized. The barrier film may be treated by using ozone water, or a solution in which sulfuric acid, hydrochloric acid, or nitric acid is mixed with hydrogen peroxide solution to form an oxide film (a chemical oxide). As other methods, plasma treatment in oxidization atmosphere or ultraviolet irradiation in oxygen-containing atmosphere may be adopted to form an oxide film, or an insulating film including a silicon oxide film may be formed by a plasma CVD method, a sputtering method, or a vapor-deposition method.

As shown in FIG. 4B, a second semiconductor film 405 that serves as a gettering sink is formed to be 25 to 250 nm thick over the barrier film. At this time, a pretreatment is performed in the film formation chamber as described in Embodiment Mode 1 or 2, and then the second semiconductor film including a silicon mainly is formed by a sputtering method. The second semiconductor film has nitrogen concentration of $1\times10^{18}$ atoms/cm$^3$ or lower, oxygen concentration of $8\times10^{19}$ atoms/cm$^3$ or lower, and noble gas concentration of $1\times10^{20}$ atoms/cm$^3$ or higher.

Preferably, the density of the second semiconductor film is low, since the second semiconductor film is to be removed in the later process. For example, a semiconductor film having a low density can be formed by allowing the second semiconductor film to contain 25 to 40 atom percent of hydrogen.

After that, Ni, which is a metal element within the first crystalline semiconductor film, is diffused and moved into the second semiconductor film that serves as a gettering sink by performing a heat treatment to perform a gettering treatment. The heat treatment may be performed by a furnace annealing method, a LRTA method or a GRTA method. When the furnace annealing method is employed, the heat treatment is performed for 0.5 to 12 hours at temperatures from 450 to 600° C. in a nitrogen atmosphere. Also, when the LRTA method is employed, a lamp light source for heating is kept on for 1 to 60 seconds, preferably for 30 to 60 seconds, and it is repeated from 1 time to 10 times, preferably from 2 times to 6 times. Luminescence intensity of the lamp light source may be set on arbitrary bases. Also, it is set so that the semiconductor film may be heated at temperatures from 600 to 1000° C. momentarily, and heated at as high as about 700 to 750° C. preferably.

In addition, the heat treatment for gettering may be performed to crystallize the first semiconductor film. That is, it is possible to achieve a gettering and crystallize the first semiconductor film by performing one time heat treatment, and thereby reducing the number of processes.

After that, the second semiconductor film 406 is removed by wet etching. As etching methods, wet etching by an alkali solution such as a solution containing hydrazine or tetramethyl ammonium hydroxide (TMAH) can be adopted. At this time, the barrier layer functions as an etching stopper. Also, the barrier layer may be removed by hydrofluoric acid, after the second semiconductor is etched.

The thus formed crystalline semiconductor film has crystals with an elongated stick or elongated flat shape due to an action of the metal element and each crystal has grown with a specific directionality when seen in broad perspective.

Then, boron is added into the crystalline semiconductor film (referred to as a channel doping). Thereafter, as shown in FIG. 4C, the crystalline semiconductor film is patterned to have a desired shape as an active layer (406*a* to 406*d*).

Subsequently, the surface of the active layer is rinsed with an etchant including hydrofluoric acid and then form a gate insulating film 407 for covering the active layer is formed. The gate insulating film 407 is formed from an insulating film including silicon to be 40 to 150 nm thick by plasma CVD method or a sputtering method. In this embodiment mode, a silicon oxynitride film (composition ratio: Si=32%, O=59%, N=7%, H=2%) is formed with a thickness of 115 nm by a plasma CVD method. It is natural that the gate insulating film should not be limited to an oxynitride film. A single layer having an insulating film made of other film containing silicon or a laminate having insulating films made of other films containing silicon may be employed.

Next, as shown in FIG. 4D, over the gate insulating film, a first conductive film 411 with a thickness of 20 to 100 nm and a second conductive film 412 with a thickness of 100 to 400 run are formed in lamination to form a gate electrode. In this embodiment mode, a 50 nm thick tantalum nitride (TaN) film and a 370 nm thick tungsten (W) film are sequentially laminated over the gate insulating film 407 to form the gate electrode.

As a conductive material for forming the first conductive film and the second conductive film, an element selected from the group consisting of Ta, W, Ti, Mo, Al and Cu, or an alloy material or a compound material containing any one of the above-described elements as its main component is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten for the first conductive film, an alloy film of aluminum and titanium (Al—Ti) may be used in place of the alloy film of aluminum and silicon (Al—Si) for the second conductive film, and a titanium film may be used in place of the titanium nitride film for the third conductive film. Alternatively, a single layer structure may also be adopted. The TaN film is used for the first conductive film and the W film for the second conductive film in this embodiment mode.

Then, gate electrodes and wirings are each formed by patterning according to the procedures described below. The first and second conductivity films can be etched to have a desired tapered shape by using ICP (inductively coupled plasma) etching method and suitably adjusting the etching conditions (the amount of power applied to a coiled electrode, the amount of power applied to an electrode on the substrate side, the temperature of the electrode on the substrate side, etc.). An etching gas can be chosen appropriately from a chlorine-based gas typified by Cl$_2$, BCl$_3$, SiCl$_4$, or CCl$_4$, a fluorine-based gas typified by, CF$_4$, SF$_6$, or NF$_3$, and O$_2$.

A resist pattern having a desired shape is formed over the second conductive film. As the first etching condition, $CF_4$, $Cl_2$, and $O_2$ are used as etching gases, the flow rate ratio of the gases is set to 25/25/10 sccm, and, at a pressure of 1 Pa, RF (13.56 MHz) power of 700 W is applied also to the coiled electrode and RF (13.56 MHz) power of 150 W is applied also to an electrode on the substrate side (sample stage) to substantially apply a negative self-bias voltage. The area of the electrode on the substrate side is 12.5 cm×12.5 cm, and the area of the coiled electrode (here, quartz disc provided with coil) is 25 cm diameter disc. The W film as the second conductive film only is etched so as to allow end portions thereof to have a tapered shape having an angle of from 15 to 45° in this etching condition.

Then, second etching is performed without removing a mask made of resist (hereinafter, a resist mask). As the second etching condition, $CF_4$ and $Cl_2$ are used as etching gases, the flow rate ratio of the gases is set to 30/30 sccm, and RF (13.56 MHz) power of 500 W is applied to the coiled electrode at a pressure of 1 Pa and RF (13.56 MHz) power of 20 W is also applied to the electrode on the substrate side (sample stage) to substantially apply a negative self-bias voltage. Under the second etching condition, both the TaN film as the first conductive film and the W film as the second conductive film are etched to the same degree.

Next, a first doping treatment for adding an impurity element that gives a semiconductor film a conductivity type is performed by using the gate electrode as a mask without removing the mask made of resist. For the first doping treatment, ion doping or ion implantation may be employed. As an impurity element that gives n-type, phosphorus (P) or arsenic (As) is typically used. First impurity regions (n+region) 408a to 408d are formed in a self-aligned manner. The first impurity regions are added with the impurity elements that give n-type at the concentration of from $1 \times 10^{20}$ to $1 \times 10^{21}/cm^3$.

Then, third etching is performed without removing the resist mask. Here, as a condition for the third etching, $CF_4$ and $Cl_2$ are used as etching gases, the flow rate ratio of the gases is set to 30/30 sccm, and RF (13.56 MHz) power of 500 W is applied to the coiled electrode at a pressure of 1 Pa and RF (13.56 MHz) power of 20 W is also applied to the electrode on the substrate side (sample stage) to substantially apply a negative self-bias voltage.

Fourth etching is performed without removing the resist mask. Here, as the fourth etching condition, $CF_4$, $Cl_2$, and $O_2$ are used as etching gases, the flow rate ratio of the gases is set to 20/20/20 sccm, and, at a pressure of 1 Pa, RF (13.56 MHz) power of 500 W is applied also to the coiled electrode and RF (13.56 MHz) power of 20 W is applied also to the electrode on the substrate side (sample stage) to substantially apply a negative self-bias voltage. Under the conditions for the third and fourth etching, the W film and the TaN films are anisotropically etched. By allowing the etching gas to contain oxygen, the W film and the TaN film become different from each other in the etching speeds, and thus, the etching speed of the W film is higher than that of the TaN film. Although not shown in figures, the gate insulating film that is not covered with the first conductive film is etched to be a thinner film. At this time, the gate electrodes and the like are formed. As the gate electrodes, 411a to 411d of the TaN film as the first conductive layer become lower portions of the gate electrodes and 412a to 412d of the W film as the second conductive layer become upper portions of the gate electrodes.

Next, second doping is conducted without removing the resist mask to add an impurity element for imparting a conductivity type to the semiconductor film by using the gate electrodes as masks. The second doping may be conducted by an ion doping method or an ion implantation method. In this embodiment mode, the ion doping method is used. A flow rate of a gas in which phosphine ($PH_3$) is diluted with hydrogen at 5% is set to 30 sccm, a dose is set to $1.5 \times 10^{14}$ atoms/$cm^2$, and an accelerating voltage is set to 90 keV. The resist mask and the second conductive layer become masks. Through the second doping, second impurity regions 409a to 409d which are overlapped with each gate electrode are formed.

Subsequently, the mask made of resist is removed, and then a new mask made of resist is formed to perform third doping. Through the third doping, the third impurity regions 408a and 408d that are given an impurity element (such as boron) for imparting p-conductivity type to a semiconductor film forming a p-channel TFT, and fourth impurity regions 409a and 409d that are overlapped with each gate electrode are formed. The third impurity regions 408a, 408d are required to be added with the impurity element for imparting the p-type at a concentration range of $1 \times 10^{20}/cm^3$ to $1 \times 10^{21}/cm^3$. Note that the third impurity regions are the region (n+region) to which phosphorus (P) is added in the preceding step. However, because the concentration of the impurity element for imparting the p-type, which is added, is 1.5 times to 3 times higher than that of phosphorus, the conductivity type becomes the p-type. The fourth impurity regions 409a and 409d are also the region to which phosphorus (P) is added in the preceding step. However, because the concentration of the impurity element for imparting the p-type, which is added, is 1.5 times to 3 times higher than that of phosphorus, the conductivity type becomes the p-type.

According to the above processes, the impurity regions each having the conductivity type of the n-type or the p-type are formed in the respective semiconductor films. After the formation of the impurity regions, a heat treatment, intense light irradiation, or laser light irradiation is conducted in order to activate the impurity element. In addition to the activation, plasma damage to the gate insulating film and plasma damage to an interface between the gate insulating film and the semiconductor layers can be recovered. In particular, the impurity element is activated by using an excimer laser from the front surface or the rear surface in an atmosphere of temperatures from a room temperature to 300° C. The irradiation of a second harmonic of the YAG laser may be conducted for activation. A YAG laser is a preferable activation unit because of easy maintenance.

Next, as shown in FIG. 4E, a passivation film 415 made of an insulating film such as a silicon oxynitride film or a silicon oxide film is formed. In this embodiment mode, a silicon oxynitride film is formed to have a thickness of 100 nm by a plasma CVD method. After that, heating is conducted at temperatures from 300° C. to 550° C. for 1 hour to 12 hours using a clean oven to hydrogenate the semiconductor film. In this embodiment mode, heating is conducted in a nitrogen atmosphere at 410° C. for 1 hour. According to this step, dangling bonds in the semiconductor layer can be terminated by hydrogen contained in the first passivation film 415. At the same time, the above-mentioned activation processing of the impurity regions can be conducted in addition to the hydrogenation.

After that, as shown in FIG. 4F, a first interlayer insulating film 416 made of an inorganic insulating film including silicon or an organic insulator material is formed over the passivation film. A positive type photosensitive organic resin or a negative type photosensitive organic resin can be used as the organic insulator material. Note that, in the case where the photosensitive organic resin is used for the first interlayer insulating film, the photosensitive organic resin is etched by an exposure treatment in a photolithography process, thereby forming a first opening portion having a curvature. When the positive type photosensitive organic resin is used for the first interlayer insulating film, it is necessary to decolorize the photosensitive organic resin after etching, since the positive type photosensitive organic resin is colored brown. In this embodiment mode, a silicon oxide film having a thickness of 1.5 μm is formed as a first interlayer insulating film by plasma CVD method.

After that, a second passivation film 417 made of a nitride insulating film (typically, a silicon nitride film or a silicon nitride oxide film) is formed to cover the first interlayer insulating film 416. In this embodiment mode, a silicon nitride film is used for the second passivation film. With respect to film formation conditions, a silicon target may be used by a sputtering method using high frequency discharge, and a nitrogen gas may be used as a sputtering gas. A pressure may be set as appropriate within 0.5 Pa to 1.0 Pa. Discharge power may be within 2.5 kW to 3.5 kW. A film formation temperature may be at temperatures from a room temperature 25° C. to 250° C. When the second passivation film 417 made from the nitride insulating film is formed, degassing produced from the first interlayer insulating film 416 can be suppressed.

Next, the second passivation film 417, the first interlayer insulating film 416, the first passivation film 415, and the gate insulating film 407 are etched in order, thereby forming opening portions. At this time, etching treatment may be dry etching treatment or wet etching treatment. In this embodiment mode, the opening portions having tapered angle are formed by dry-etching. After forming the opening portions, a metal film is formed over the second passivation film and the opening portions, and then, the metal film is etched to form a source/drain electrode 418, wirings (not shown). A film comprising an element selected from the group consisting of aluminum (Al), titanium (Ti), molybdenum (Mo), tungsten (W), and silicon (Si) or an alloy film made from those elements may be used as the metal film. In this embodiment mode, a titanium film, a silicon-aluminum alloy film, and a titanium film (Ti/Al—Si/Ti) are laminated to be 100 nm, 350 nm, and 100 nm in thickness, respectively, and then shaped into a desired shape by patterning and etching, thereby forming a source/drain electrode and wirings (not shown). After that, an electrode 420 (which becomes an anode or a cathode in a light emitting device) is formed. A transparent conductive film of ITO, $SnO_2$, or the like can be used for the electrode 420. In this embodiment mode, an ITO film is formed to have a thickness of 110 nm and etched to have a desired shape, thereby forming the electrode 420.

According to the above-mentioned process, an active matrix substrate including TFTs is completed.

In the present invention, a semiconductor film in which nitrogen concentration is $1 \times 10^{18}$ atoms/cm$^3$ or lower, oxygen concentration is $8 \times 10^{19}$ atoms/cm$^3$ or lower, and noble gas concentration is $1 \times 10^{20}$ atoms/cm$^3$ or higher is formed. Etch residue in the semiconductor film can be reduced by gettering. An active matrix substrate which has a favorable and good crystalline semiconductor film and includes TFTs having good device properties can be provided.

In this embodiment mode, although a TFT having a top-gate structure is described, a TFT having a bottom-gate structure may be employed.

EMBODIMENT MODE 4

In this embodiment mode, being different from Embodiment Mode 3, a method for manufacturing an active matrix substrate formed over a quartz substrate that is relatively resistant to a high temperature is described. Here, like Embodiment Mode 3, a driver circuit portion including an n-channel TFT and a p-channel TFT, and a pixel portion including an n-channel TFT is described. Note that, semiconductor films and respective electrodes may be formed of materials selected from the materials described in Embodiment Mode 1.

Figure 5A:
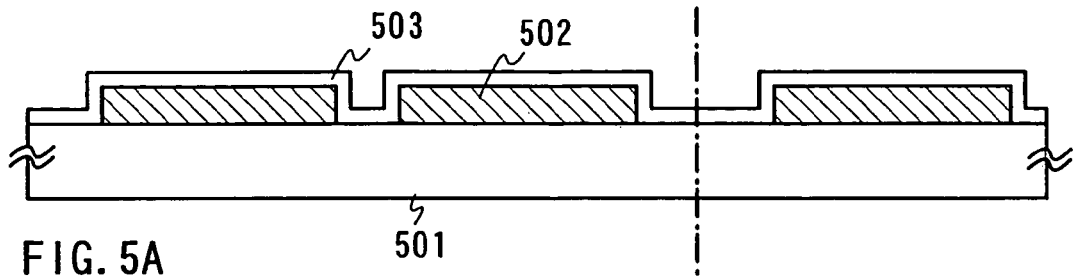
FIGS. 5A to 5E show steps for fabricating an active matrix substrate according to the present invention.

First, as shown in FIG. 5A, an amorphous silicon film 502 is formed over a quartz substrate 501 as a first semiconductor film. Because an impurity such as alkali metal that adversely affects operations of TFTs is not mixed in a quarts substrate, a base film that prevents the impurity from entering into the TFTs is not necessarily provided. Then, the amorphous silicon film is formed over the quartz substrate 501 by any one of the methods described in Embodiment Mode 3. Then, a substance including a metal element is formed so that the substance can be contact with the amorphous silicon film by any one of the methods described in Embodiment Mode 3. Thereafter, hydrogen or other gases are expelled from the amorphous silicon film by heat treatment for one hour at the temperature 450° C. A crystalline semiconductor film (a crystalline silicon film in this embodiment mode) is formed by heat treatment for 8 hours at the temperature of 600° C. Irradiation of a laser beam may be performed as shown in Embodiment Mode 3 for the sake of promoting the crystallinity as necessary.

Subsequently, an insulating film to be a barrier film is formed over the first semiconductor film that was crystallized as shown in Embodiment Mode 3. A second semiconductor film that serves as a gettering sink is formed to be 25 to 250 nm thick over the barrier film. At this time, a pretreatment is performed in the film formation chamber as described in Embodiment Mode 1 or 2, and then, the second semiconductor film including silicon mainly is formed by a sputtering method. The second semiconductor film has nitrogen concentration of $1 \times 10^{18}$ atoms/cm$^3$ or lower, oxygen concentration of $8 \times 10^{19}$ atoms/cm$^3$ or lower, and noble gas concentration of $1 \times 10^{20}$ atoms/cm$^3$ or higher. Preferably, the density of the second semiconductor film is low, since the second semiconductor film is to be removed in the later process. For example, a semiconductor film having a low density can be formed by allowing the second semiconductor film to contain 25 to 40 atom percent of hydrogen.

After that, Ni that is a metal element within the first crystalline semiconductor film is diffused and moved into the second semiconductor film that serves as a gettering sink by performing heat treatment for gettering, according to any method shown in Embodiment Mode 3. In addition, the heat treatment for gettering may be performed also to crystallize the first semiconductor film. That is, it is possible to perform a gettering and crystallize the first semiconductor film by performing one time heat treatment, and thereby reducing the number of processes.

After that, the second semiconductor film is removed by wet etching. As etching methods, the method that is described in Embodiment Mode 3 may be adopted. At this time, the barrier layer functions as an etching stopper. After that, the barrier layer may be removed by hydrofluoric acid.

The thus formed crystalline semiconductor film has crystals with an elongated stick or elongated flat shape due to an action of the metal element and each crystal has grown with a specific directionality when seen in broad perspective.

Figure 5B:
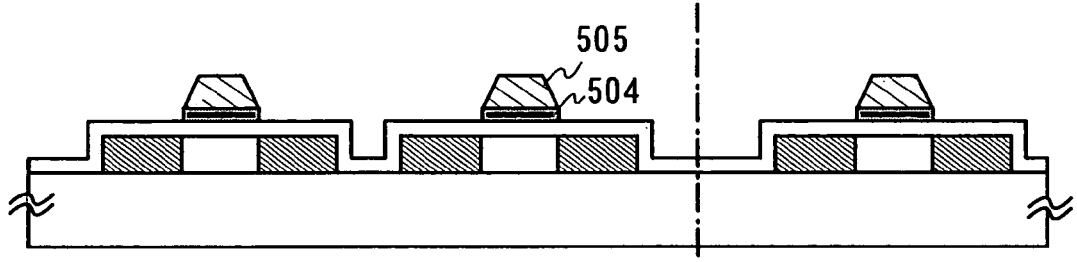

Next, the crystalline silicon film is patterned into a desired shape and a gate insulating film 503 is formed by thermal oxidation. Then, boron is added to the crystalline silicon film (channel doping). After that, as shown in FIG. 5B, gate electrodes are formed over the gate insulating film. In this embodiment mode, each of the gate electrodes comprises a laminate of a tantalum nitride (TaN) 504 and a tantalum 505.

Then, a mask of a silicon oxide film is formed, opening portions are formed over impurity regions, and an impurity element such as phosphorus or boron is added, thereby forming a source/drain region. Note that, a method of forming the source/drain region may be known by reference to Embodiment Mode 3 and low concentration impurity regions overlapped with the gate electrode may be provided as appropriate.

After that, activation of the impurity regions is conducted in a nitrogen atmosphere at 800° C. for 1 hour. In this embodiment mode, the activation can be conducted at a high temperature of 800° C. because the quartz substrate is used.

Figure 5C:
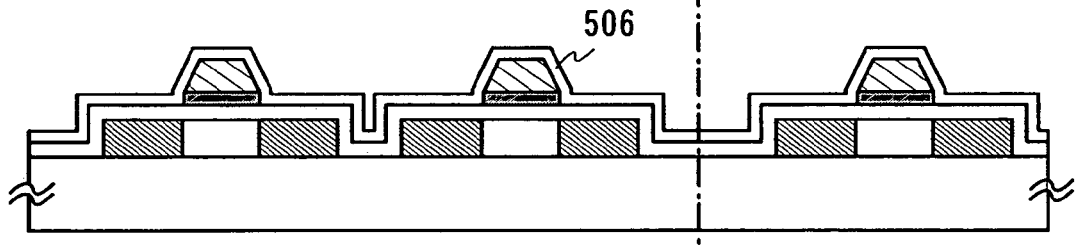
Figure 5D:
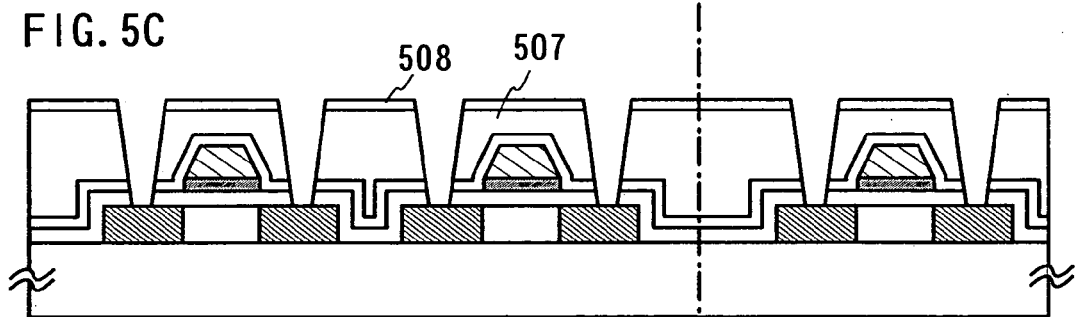

Next, as shown in FIG. 5C, a passivation film 506 of silicon nitride is formed and hydrogenation of the semiconductor films is conducted. Then, as shown in FIG. 5D, a first interlayer insulating film 507 is formed over the passivation film and an insulating film 508 including nitride is formed thereover. An acrylic resin material is applied to the whole face of the passivation film and then, over the film, a silicon nitride film is formed by sputtering. After that, a resist mask having a predetermined shape is formed, the first interlayer insulating film and the silicon nitride film are etched to form a contact having a tapered shape over the source/drain region. The tapered shape of the contact can also have a curvature radius depending on a material for an interlayer insulating film or a condition for exposure.

Figure 5E:
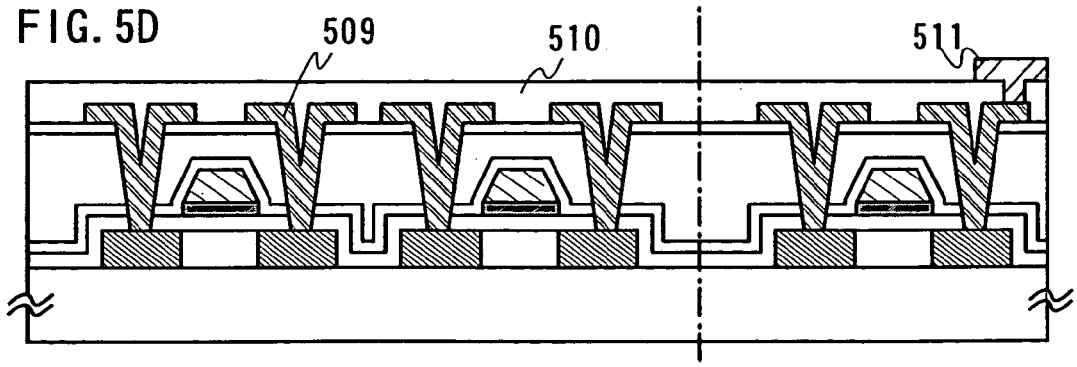

As shown in FIG. 5E, source/drain wirings 509, in which a titanium (Ti) film, an aluminum-silicon alloy (Al—Si) film, and a titanium (Ti) film are laminated, are formed in the opening portions. Then, a second interlayer insulating film 510 is formed of an organic resin material and an electrode 511 (which becomes an anode or a cathode of an EL display device, or becomes a pixel electrode of a liquid crystal display device) is formed via a contact formed in the interlayer insulating film.

The interlayer insulating film described in Embodiment Modes 1 and 2 or an insulating film including nitride can be used in the process of Embodiment Mode 3.

According to the above-mentioned process, an active matrix substrate including TFTs is completed.

According to the present invention, even in the process of using a quartz substrate, a semiconductor film that serves as a gettering sink in which nitrogen concentration is $1\times10^{18}$ atoms/cm$^3$ or lower, oxygen concentration is $8\times10^{19}$ atoms/cm$^3$ or lower, and further, noble gas concentration is $1\times10^{20}$ atoms/cm$^3$ or higher can be formed. Etch residue can be reduced by performing the gettering by using the semiconductor film. An active matrix substrate having a favorable and good crystalline semiconductor film and including TFTs having good device properties can be provided.

In this embodiment mode, although a TFT having a top-gate structure is described, a TFT having a bottom-gate structure may be employed.

EMBODIMENT MODE 5

Figure 6A:
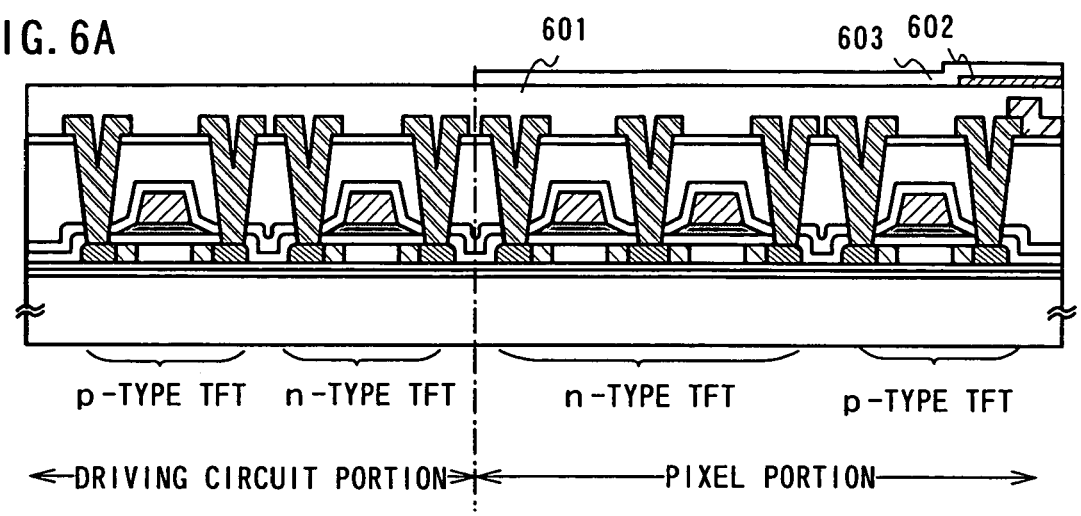
FIGS. 6A and 6B show a method for manufacturing an EL display device according to the present invention.
Figure 6B:
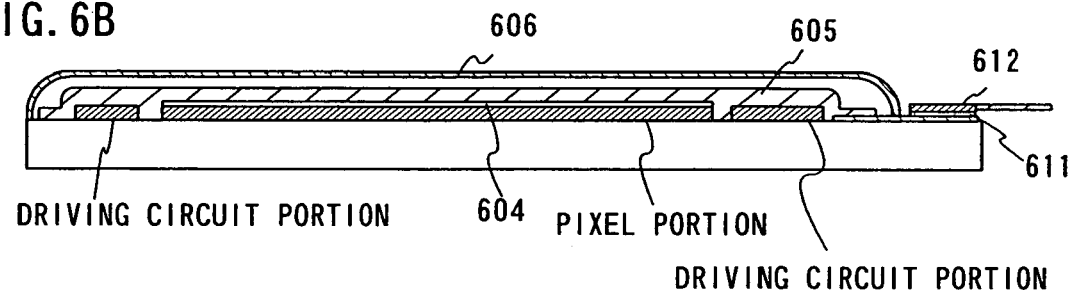

In this embodiment mode, is described an example, with reference to FIGS. 6A and 6B, of forming a EL display device (EL display module) in which a light emitting element is provided for an active matrix substrate which is formed according to the method described in Embodiment Mode 3 or 4.

First, when the electrode 420 or 511 as described in Embodiment Mode 3 or 4 becomes an anode of the EL display device, the electrode is made of a metal (Pt, Cr, W, Ni, Zn, Sn, or In) having a large work function. In this embodiment mode, the electrode is formed of ITO having a large work function and etched to have a desired shape.

Next, as shown in FIG. 6A, an insulator 601 (which is called a bank, an isolation wall, a partition wall, a mound, or the like) covering edge portions of the electrode 420 or 511 is formed. The insulator 601 may be made of a photosensitive organic resin. For example, when a negative type photosensitive acrylic resin is used as a material of the insulator, the insulator 601 having a curved surface having a first curvature radius in an upper end portion thereof and a curved surface having a second curvature radius in a lower end portion thereof can be formed. Preferably, the first curvature radius and the second curvature radius are set to from 0.2 μm to 3 μm. In addition, the insulator 601 may be covered with another passivation film made of an aluminum nitride film, an aluminum nitride oxide film, or a silicon nitride film. In this embodiment mode, a positive type photosensitive acrylic resin is used as a material of the insulator 601.

After that, contaminants and the like are removed by wiping using a PVA (polyvinyl alcohol) base porous material. In this embodiment mode, dusts (contaminants) generated at a time when the ITO film and the insulating films are etched can be removed by wiping using bellclean.

Next, in a pretreatment before vapor deposition of a light emitting layer (layer containing organic compounds), PEDOT may be applied onto the entire surface and then, baking may be conducted. At this time, preferably, once the PEDOT is applied, then washing is conducted and the PEDOT is applied again because the PEDOT has low wettability with ITO. After that, heating is conducted in a low pressure atmosphere. In this embodiment mode, after the application of the PEDOT, heating is conducted at the temperature of 170° C. for 30 minutes in a low pressure atmosphere, followed by natural cooling for 30 minutes.

Then, by using a vapor deposition apparatus, vapor deposition is conducted while a vapor deposition source is being moved. For example, vapor deposition is conducted in a film formation chamber whose air is evacuated up to the degree of vacuum of $5\times10^{-3}$ Torr (0.665 Pa) or lower, preferably, $10^{-4}$ Torr to $10^{-6}$ Torr. In the vapor deposition, the organic compounds are vaporized: in advance by resistance heating. During the vapor deposition, a shutter is opened, so that the vaporized organic compounds are scattered toward the substrate. The vaporized organic compounds are scattered upward and vapor-deposited onto the substrate through opening portions provided in a metal mask, thereby forming a light emitting layer 602 (including a hole transporting layer, a hole injecting layer, an electron transporting layer, and an electron injecting layer).

Next, a second electrode 603 is formed as a cathode over the above-mentioned light emitting layer. The second electrode 603 may be made of a thin film containing metal (Li, Mg, or Cs) having a small work function. In addition, it is preferable that the second electrode be made from a laminate film in which a transparent conductive film (ITO (alloy of indium oxide and tin oxide), alloy of indium oxide and zinc oxide ($In_2O_3$—ZnO), zinc oxide (ZnO), or the like) is laminated over the thin film containing Li, Mg, Cs, or the like. Further, in order to reduce a resistance of the cathode, an auxiliary electrode may be provided over the insulator 601.

Here, the example in which the light emitting layer 602 is formed by a vapor deposition method is described. However, the present invention is not particularly limited to this example. A light emitting layer made of a polymer may be formed by an application method (such as spin coating method, ink-jet method). In addition, in this embodiment mode, the example in which the layer made from a low molecular material is laminated as the organic compound layer is described. However, a layer made of a polymer material and a layer made of a low molecular material may be laminated. In addition, RGB light emitting layers may be formed to achieve full color display, or in the case of forming a monochrome light emitting layer, full color display may be achieved by using a color conversion layer or a color filter.

Note that, with respect to an EL display device, two structures are considered according to a light emitting direction. One is a structure in which light emitted from a light emitting device passes through the second electrode 603 and reaches the eyes of an observer. The other is a structure in which the light emitted from the light emitting device passes through the electrode 420 or 511 and through the substrate and reaches the eyes of the observer. When a structure in which light emitted from the light emitting device passes through a first electrode and reaches the eyes of the observer is used, it is desirable to use a translucent material for the electrode 420 or 511.

After forming the second electrode 603 according to the above-mentioned processes, the next steps are, as shown in the entire view of an EL display device in FIG. 6B, as follows: a silicon nitride film is provided as a first protective film 604; a resin film made of a ultraviolet curable resin, an epoxy resin, or other resin is provided as a second protective film 605; and a plastic film is provided as a cover material 606 thereover. Note that, preferably, the surface of the plastic film is covered with an inorganic insulating film such as a silicon nitride film to prevent moisture and oxygen from passing through the film. After that, an FPC (flexible printed circuit) 612 is connected with an external terminal by using an anisotropic conductive film 611, thereby completing the EL display device (EL display module).

Thus, according to the present invention, a semiconductor film that serves as a gettering sink in which nitrogen concentration is $1\times10^{18}$ atoms/cm$^3$ or lower, oxygen concentration is $8\times10^{19}$ atoms/cm$^3$ or lower, and noble gas concentration is $1\times10^{20}$ atoms/cm$^3$ or higher can be formed. Therefore, etch residue in the semiconductor film can be reduced, and therefore, an EL display device having a higher yield can be manufactured.

EMBODIMENT MODE 6

Figure 7A:
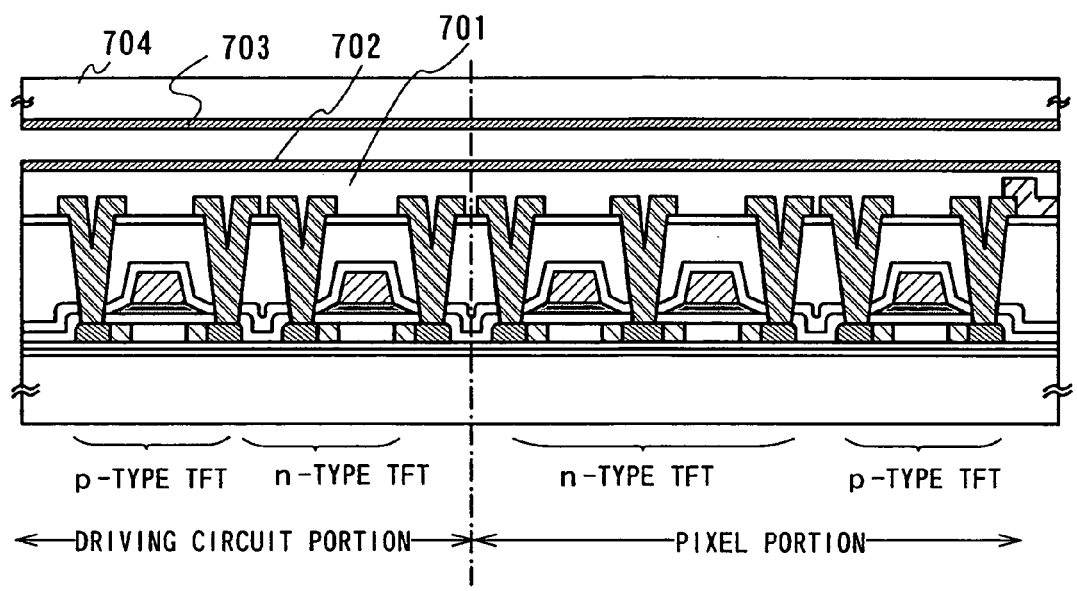
FIGS. 7A and 7B show a method for manufacturing a liquid crystal display device according to the present invention.
Figure 7B:
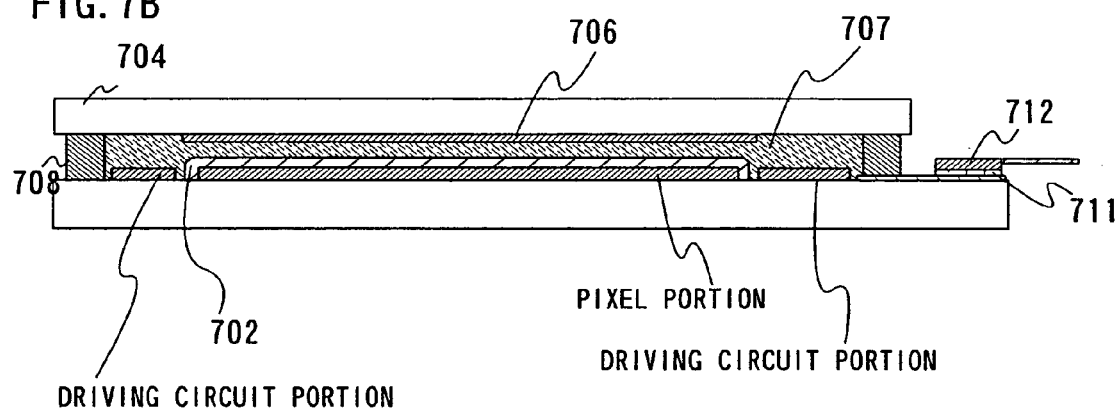

In this embodiment mode, referring to FIGS. 7A and 7B, an example is described in which a liquid crystal device is provided in the active matrix substrate formed in the way described in Embodiment Mode 3 or 4, thereby producing a liquid crystal display device (liquid crystal display module).

First, the electrode 420 or 511 described in Embodiment Mode 3 or 4 is formed of ITO and the electrode is used as a pixel electrode of a transmissive liquid crystal display device. Note that, in the case of a reflection liquid crystal display device, the pixel electrode may be made of a metal film such as Al. After that, as shown in FIG. 7A, a planarizing film 701 is made of an organic material. At this time, the planarizing film may be made of an inorganic material and flattened by CMP or the like.

After that, an alignment film 702 is provided on the active matrix substrate. An opposite electrode 703 is provided in an opposite substrate 704 prepared in advance. As shown in FIG. 7B, the opposite substrate and the active matrix substrate are bonded to each other by a sealant 708 and then a liquid crystal 707 is injected between the both, thereby producing a liquid crystal cell. Note that, the liquid crystal device is a device that controls light transmission or non-light transmission according to an optical modulation action of the liquid crystal. The liquid crystal device comprises a pair of electrodes and the liquid crystal interposed between the electrodes. Further, an FPC (flexible printed circuit) 712 may be bonded by an anisotropic conductive film 711 to form an external terminal.

Thus, according to the present invention, a semiconductor film that serves as a gettering sink in which nitrogen concentration is $1\times10^{18}$ atoms/cm$^3$ or lower, oxygen concentration is $8\times10^{19}$ atoms/cm$^3$ or lower, and noble gas concentration is $1\times10^{20}$ atoms/cm$^3$ or higher can be formed. Therefore, etch residue in the semiconductor film can be reduced, and therefore, a liquid crystal display device having a higher yield can be manufactured.

EMBODIMENT

EMBODIMENT 1

This embodiment describes outcomes of impurity concentration in a gettering sink measured in both a case in which residue is generated in a gettering sink and a case in which residue is not generated in a gettering sink.

An oxynitride (SiNO) film (50 nm) and a nitride oxide (SiON) film (100 nm) are laminated as a base film over a glass substrate. For example, the SiON film is formed by a plasma CVD method under a condition in which $SiH_4$ and $N_2O$ are used as a material gas, the pressure is 0.3 Torr, RF power is 150 W, RF frequency is 60 MHz, and the substrate temperature is 400° C. The SiNO film is formed by a plasma CVD method under a condition in which $SiH_4$, $N_2O$, $NH_3$, and $H_2$ are used as a material gas, the pressure is 0.3 Torr, RF power is 50 W, RF frequency is 60 MHz, and the substrate temperature is 400° C. After that, an amorphous silicon film (a first amorphous silicon film) is formed to be 50 nm over the base film, and 10 ppm solution containing a metal element Ni is applied to the first amorphous silicon film. After that, the first amorphous silicon film is heated for one hour at the temperature of 500° C., and then, for four hours at the temperature of 550° C. for crystallization of the first amorphous silicon film. The first amorphous silicon film is irradiated by a XeCl excimer laser, thereby reducing defects in grains and enhancing crystallinity by enlarging grain size to form a first crystalline silicon film.

Subsequently, a barrier film is formed over the first crystalline silicon film by applying ozone water using a washing machine. An amorphous silicon film (a second amorphous silicon film) that is to function as a gettering sink is formed to be 50 nm by sputtering. At this time, a pressure of film formation is set 0.4 Pa, a substrate temperature 150° C., electric power of film formation is 3 Kw, the size of a target is 12 inches square, a film formation gas is Ar, the flow rate thereof is set 50 sccm, and further, 10 sccm heated Ar is supplied to the vicinity of the substrate.

When the second amorphous silicon is formed, a pretreatment of the present invention is performed to reduce impurity concentration. As a result, the second amorphous silicon film in which nitrogen concentration is $1\times10^{18}$ atoms/cm$^3$ or lower, oxygen concentration is $8\times10^{19}$ atoms/cm$^3$ or lower, and Ar concentration is $1\times10^{20}$ atoms/cm$^3$ or higher is obtained.

A heat treatment is performed using a vertical furnace for 4 hours at the temperature of 550° C. so that Ni can be diffused into the second amorphous silicon film by gettering.

After gettering is finished, in a constant temperature bath, TMAH is held in a quartz container at the temperature of 50° C., and the second amorphous silicon film is removed by etching for approximately 3 minutes. In this case, as described in Embodiment Modes, the barrier film functions as an etching stopper, and thus, the first crystalline silicon film is not etched. Thereafter, the barrier film is removed by a hydrofluoric acid treatment to obtain a crystalline silicon film having Ni concentration of $3\times10^{16}$ atoms/cm$^3$ or lower.

Table 1 shows impurity concentration of carbon, nitrogen, oxygen, and chlorine in the crystalline semiconductor film (a measured sample 1) formed as described above and a crystalline semiconductor film (a measured sample 2) formed according to a conventional method.

As apparent from the table 1, the sample formed according to the present invention exhibits each low concentration of the impurities. That is, it can be known that impurity concentration (particularly, oxygen concentration or nitrogen concentration) is required to control in order to reduce etch residue.

A cause of generating residue of a gettering sink is considered as follows: even if noble gas concentration in gettering sink is the same, oxygen becomes an extraction core to reduce a degree of solution of a metal element. Therefore, in the case of oxygen concentration in a gettering sink increase and an extraction nucleus exists due to the oxygen, it is difficult to dissolve residue when the gettering sink is removed by etching, and thus, the residue is generated.

According to the present invention, a gettering sink can be removed precisely while keeping a predetermined gettering function, by controlling impurity concentration in the gettering sink, thereby enhancing a yield in TFT fabricating. When residue is not left a gettering defect is not generated. Therefore, fluctuation in electric characteristic of a TFT becomes smaller, and thus, the reliability becomes better.

According to the present invention, in a chamber in which a semiconductor film that serves as a gettering sink is formed, a pretreatment is performed to reduce impurity concentration, thereby making nitrogen concentration set to $1\times10^{18}$ atoms/cm$^3$ or lower, oxygen concentration set to $8\times10^{19}$ atoms/cm$^3$ or lower in the semiconductor film. Noble gas concentration is set to $1\times10^{20}$ atoms/cm$^3$ or higher so that a semiconductor film as a gettering sink can achieve a desired gettering function. Accordingly, etch residue in the semiconductor film can be reduced. Therefore, etch residue is reduced as compared with a method for manufacturing a TFT using a semiconductor film that serves as a gettering sink according to a conventional method. Therefore, it is possible to manufacture a display device having a TFT with a better yield.

What is claimed is:

1. A method for fabricating a thin film transistor, comprising:
   forming a first amorphous semiconductor film;
   forming a material including a metal element to promote crystallization over the first amorphous semiconductor film;
   heating the first amorphous semiconductor film to form a first crystalline semiconductor film;
   forming a second amorphous semiconductor film over the first crystalline semiconductor film by sputtering while a magnetic field is applied to a target using a magnet in a chamber;
   heating the first crystalline semiconductor film and the second amorphous semiconductor film; and
   removing the second amorphous semiconductor film,
   wherein the second amorphous semiconductor film serves as a gettering sink, and
   wherein the second amorphous semiconductor film comprises nitrogen at a concentration of $1\times10^{18}$ atoms/cm$^3$ or lower, oxygen at a concentration of $8\times10^{19}$ atoms/cm$^3$ or lower, and noble gas at a concentration of $1\times10^{20}$ atoms/cm$^3$ or higher.

2. A method for fabricating a thin film transistor, comprising:
   forming a first amorphous semiconductor film;
   forming a material including a metal element to promote crystallization over the first amorphous semiconductor film;
   forming a second amorphous semiconductor film over the first amorphous semiconductor film by sputtering while a magnetic field is applied to a target using a magnet in a chamber;
   heating the first amorphous semiconductor film and the second amorphous semiconductor film; and
   removing the second amorphous semiconductor film,
   wherein the second amorphous semiconductor film serves as a gettering sink, and
   wherein the second amorphous semiconductor film comprises nitrogen at a concentration of $1\times10^{18}$ atoms/cm$^3$ or lower, oxygen at a concentration of $8\times10^{19}$ atoms/cm$^3$ or lower, and noble gas at a concentration of $1\times10^{20}$ atoms/cm$^3$ or higher.

3. A method for fabricating a thin film transistor according to claim 1, wherein the second amorphous semiconductor film is removed by wet etching using hydrazine or tetramethyl ammonium hydroxide.

4. A method for fabricating a thin film transistor according to claim 2, wherein the second amorphous semiconductor film is removed by wet etching using hydrazine or tetramethyl ammonium hydroxide.

5. A method for fabricating a thin film transistor according to claim 1,
   wherein the noble gas element is one element or more elements selected from a group consisting of helium (He), neon (Ne), argon (Ar), krypton (Kr), and xenon (Xe).

TABLE 1

| IMPURITY CONCENTRATION (atoms/cm$^3$) | CARBON | NITROGEN | OXYGEN | CHLORINE |
|---|---|---|---|---|
| MEASURED SAMPLE 1 (PRESENT INVENTION) | $2.00\times10^{18}$ | $4.00\times10^{17}$ | $3.00\times10^{18}$ | $3.00\times10^{15}$ |
| MEASURED SAMPLE 2 (PRIOR ART) | $8.00\times10^{19}$ | $1.00\times10^{19}$ | $9.00\times10^{19}$ | $1.00\times10^{17}$ |

6. A method for fabricating a thin film transistor according to claim 2, wherein the noble gas element is one element or more elements selected from a group consisting of helium (He), neon (Ne), argon (Ar), krypton (Kr), and xenon (Xe).

7. A method for fabricating a thin film transistor according to claim 1, wherein the metal element is one element or more elements selected from a group consisting of iron (Fe), nickel (Ni), cobalt (Co), ruthenium (Ru), rhodium (Rh), palladium (Pd), osmium (Os), iridium (Ir), platinum (Pt), copper (Cu), and gold (Au).

8. A method for fabricating a thin film transistor according to claim 2, wherein the metal element is one element or more elements selected from a group consisting of iron (Fe), nickel (Ni), cobalt (Co), ruthenium (Ru), rhodium (Rh), palladium (Pd), osmium (Os), iridium (Ir), platinum (Pt), copper (Cu), and gold (Au).

9. A method for fabricating a thin film transistor according to claim 1, wherein a pretreatment is performed in the chamber.

10. A method for fabricating a thin film transistor according to claim 1, wherein the second amorphous semiconductor film contains hydrogen.

11. A method for fabricating a thin film transistor according to claim 2, wherein a pretreatment is performed in the chamber.

12. A method for fabricating a thin film transistor according to claim 2, wherein the second amorphous semiconductor film contains hydrogen.

* * * * *